(12) United States Patent
Furukawa et al.

(10) Patent No.: US 7,932,167 B2
(45) Date of Patent: Apr. 26, 2011

(54) PHASE CHANGE MEMORY CELL WITH VERTICAL TRANSISTOR

(75) Inventors: Toshiharu Furukawa, Essex Junction, VT (US); John G. Gaudiello, Waterford, NY (US); Mark Charles Hakey, Fairfax, VT (US); Steven J. Holmes, Guilderland, NY (US); David V. Horak, Essex Junction, VT (US); Charles William Koburger, III, Delmar, NY (US); Chung Hon Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 880 days.

(21) Appl. No.: 11/771,457

(22) Filed: Jun. 29, 2007

(65) Prior Publication Data

US 2009/0001337 A1   Jan. 1, 2009

(51) Int. Cl.
*H01L 21/44* (2006.01)

(52) U.S. Cl. ........ 438/597; 438/239; 438/240; 438/241; 438/242; 438/238; 438/152; 438/153; 257/E31.029; 257/3; 257/4; 257/5; 257/394

(58) Field of Classification Search .................... 438/597
See application file for complete search history.

(56) References Cited

U.S. PATENT DOCUMENTS

| | | | |
|---|---|---|---|
| 5,874,760 A | 2/1999 | Burns, Jr. et al. | |
| 5,985,698 A * | 11/1999 | Gonzalez et al. | 438/128 |
| 6,153,890 A * | 11/2000 | Wolstenholme et al. | 257/3 |
| 6,236,059 B1 * | 5/2001 | Wolstenholme et al. | 257/3 |
| 6,326,275 B1 | 12/2001 | Harrington et al. | |
| 6,420,215 B1 * | 7/2002 | Knall et al. | 438/131 |
| 6,420,725 B1 * | 7/2002 | Harshfield | 257/4 |
| 6,605,527 B2 * | 8/2003 | Dennison et al. | 438/618 |
| 6,764,894 B2 * | 7/2004 | Lowrey | 438/238 |
| 6,790,733 B1 | 9/2004 | Natzle et al. | |
| 6,946,704 B2 | 9/2005 | Matsuoka et al. | |
| 7,324,372 B2 * | 1/2008 | Hanzawa et al. | 365/173 |
| 7,399,655 B2 * | 7/2008 | Dennison | 438/95 |
| 7,442,603 B2 * | 10/2008 | Lai et al. | 438/238 |
| 7,442,663 B2 * | 10/2008 | Tomita | 501/141 |
| 7,463,512 B2 * | 12/2008 | Lung | 365/163 |
| 7,485,487 B1 * | 2/2009 | Breitwisch et al. | 438/95 |
| 7,511,297 B2 * | 3/2009 | Jang et al. | 257/42 |
| 7,842,536 B2 * | 11/2010 | Lung | 438/95 |
| 2002/0070379 A1 * | 6/2002 | Dennison | 257/5 |
| 2004/0179388 A1 * | 9/2004 | Matsuoka et al. | 365/145 |
| 2004/0262635 A1 * | 12/2004 | Lee | 257/199 |

(Continued)

*Primary Examiner* — N Drew Richards
*Assistant Examiner* — Ankush K Singal
(74) *Attorney, Agent, or Firm* — Alexanian Vazken; Ryan, Mason & Lewis, LLP

(57) ABSTRACT

A memory cell in an integrated circuit is fabricated in part by forming a lower electrode feature, an island, a sacrificial feature, a gate feature, and a phase change feature. The island is formed on the lower electrode feature and has one or more sidewalls. It comprises a lower doped feature, a middle doped feature formed above the lower doped feature, and an upper doped feature formed above the middle doped feature. The sacrificial feature is formed above the island, while the gate feature is formed along each sidewall of the island. The gate feature overlies at least a portion of the middle doped feature of the island and is operative to control an electrical resistance therein. Finally, the phase feature is formed above the island at least in part by replacing at least a portion of the sacrificial feature with a phase change material. The phase change material is operative to switch between lower and higher electrical resistance states in response to an application of an electrical signal.

18 Claims, 16 Drawing Sheets

U.S. PATENT DOCUMENTS

| | | |
|---|---|---|
| 2005/0093022 A1* | 5/2005 | Lung .......................... 257/200 |
| 2005/0212024 A1* | 9/2005 | Happ .......................... 257/296 |
| 2006/0110877 A1* | 5/2006 | Park et al. .................. 438/238 |
| 2006/0138473 A1* | 6/2006 | Kawagoe et al. ........... 257/246 |
| 2006/0148135 A1* | 7/2006 | Matsuoka et al. .......... 438/127 |
| 2006/0152961 A1* | 7/2006 | Kim et al. .................. 365/148 |
| 2006/0157683 A1* | 7/2006 | Scheuerlein ................ 257/4 |
| 2006/0273298 A1* | 12/2006 | Petti .......................... 257/5 |
| 2007/0057323 A1 | 3/2007 | Furukawa et al. |
| 2007/0131980 A1* | 6/2007 | Lung .......................... 257/246 |
| 2007/0176261 A1* | 8/2007 | Lung .......................... 257/536 |
| 2007/0246748 A1* | 10/2007 | Breitwisch et al. ......... 257/246 |
| 2007/0257300 A1* | 11/2007 | Ho et al. .................... 257/315 |
| 2007/0278529 A1* | 12/2007 | Lai et al. .................... 257/209 |
| 2008/0061341 A1* | 3/2008 | Lung .......................... 257/303 |
| 2008/0121861 A1* | 5/2008 | Lai et al. .................... 257/4 |
| 2008/0164453 A1* | 7/2008 | Breitwisch et al. ......... 257/3 |
| 2008/0185571 A1* | 8/2008 | Happ et al. ................. 257/4 |
| 2008/0203469 A1* | 8/2008 | Gruening-von Schwerin .................. 257/327 |
| 2008/0205118 A1* | 8/2008 | Gruening-von Schwerin et al. ........................ 365/148 |
| 2009/0072216 A1* | 3/2009 | Lung et al. ................. 257/4 |
| 2009/0200536 A1* | 8/2009 | Van Schaijk et al. ....... 257/4 |

* cited by examiner

PHASE CHANGE MEMORY CELL WITH VERTICAL TRANSISTOR

Names of Parties to a Joint Research Agreement

International Business Machines Corporation, a New York Corporation, with a location at Yorktown Heights, NY ("IBM"), and Macronix International Co., Ltd., a corporation of Taiwan, Republic of China, with a location at Hsinchu 300, Taiwan, Republic of China ("Macronix"), are parties to a joint research agreement.

FIELD OF THE INVENTION

This invention relates generally to memory cells in integrated circuits, and, more particularly, to memory cells comprising phase change materials for use in integrated circuits.

BACKGROUND OF THE INVENTION

The possibility of using phase change materials (PCMs) in nonvolatile memory cells has recently gained momentum as more is learned about these materials and their integration into integrated circuits. When incorporated in a memory cell, these materials can be toggled between higher and lower electrical resistance states by applying a pulse of electrical current ("switching current pulse") to the memory cell. After writing to a memory cell in this way, the electrical resistance state of the given memory cell can be determined (i.e., read) by applying a low magnitude sensing voltage to the material in order to determine its electrical resistance.

Currently, binary and ternary chalcogenide alloys such as doped antimony telluride (SbTe) and germanium antimony telluride ($Ge_2Sb_2Te_5$) (GST) are showing the greatest promise for use in practical PCM-based memory cells. However, the switching of a PCM-based memory cell requires that the switching current pulse produce enough heat in the PCM to cause at least some portion of the PCM to reproducibly change electrical resistance state. The required local temperature may be as high as 350 degrees Celsius. If the memory cell is not properly designed, the magnitude of the switching current pulse necessary to create these required temperatures can easily exceed that which can be tolerated by modern integrated circuits.

It has been recognized that the magnitude of the required switching current pulse can be reduced by forcing the current pulse to pass through an extremely narrow feature of PCM. The confinement of the switching current to this narrow feature results in high localized current density, and, in turn, in high localized ohmic heating. Nevertheless, it remains challenging to reliably and reproducibly form constricted features of PCM with suitably narrow dimensions. This task is made even more difficult when trying to implement these constricted PCM features in densely packed memory cell arrays comprising memory cell designs capable of maintaining areas of about $4F^2$ (where F is the minimum photolithographic dimension). There remains, as a result, a need for methods of reliably and reproducibly forming constricted features of PCM in densely packed PCM-based memory cells.

SUMMARY OF THE INVENTION

Embodiments of the present invention address the above-identified need by providing methods for reliably and reproducibly forming constricted PCM features on vertical transistors.

In accordance with an aspect of the invention, a memory cell in an integrated circuit is fabricated in part by forming a lower electrode feature, an island, a sacrificial feature, a gate feature, and a phase change feature. The island is formed on the lower electrode feature and has one or more sidewalls. It comprises a lower doped feature, a middle doped feature formed above the lower doped feature, and an upper doped feature formed above the middle doped feature. The sacrificial feature is formed above the island, while the gate feature is formed along each sidewall of the island. The gate feature overlies at least a portion of the middle doped feature of the island and is operative to control an electrical resistance therein. Finally, the phase feature is formed above the island at least in part by replacing at least a portion of the sacrificial feature with a phase change material. The phase change material is operative to switch between lower and higher electrical resistance states in response to an application of an electrical signal.

In accordance with another aspect of the invention, a memory cell in an integrated circuit is fabricated in part by forming a dielectric layer, a fill feature, a hole in the fill feature, and a sacrificial feature. The dielectric layer defines a hole in which the fill feature is formed. The fill feature defines a void that overlies a portion of the fill feature in the depth direction of the memory cell. The hole in the fill feature is formed by anisotropically etching the fill feature to the extent required to remove the portion of the fill feature underlying the void. The hole is, in turn, filled by the sacrificial feature. The memory cell is further fabricated by forming an island, a gate feature, and a phase change feature. The island is formed at least partially below the sacrificial feature and has one or more sidewalls. It comprises a lower doped feature, a middle doped feature formed above the lower doped feature, and an upper doped feature formed above the middle doped feature. The gate feature overlies at least a portion of the middle doped feature of the island and is operative to control an electrical resistance therein. Finally, the phase feature is formed above the island at least in part by replacing at least a portion of the sacrificial feature with a phase change material. The phase change material is operative to switch between lower and higher electrical resistance states in response to an application of an electrical signal.

Advantageously, the size of the PCM features in the above-described method embodiments can be reliably and reproducibly formed in densely packed memory cell arrays with dimensions substantially smaller than those that can be easily attained using convention photolithography techniques. Such constricted PCM features act to force applied switching currents to pass through confined volumes of PCM during memory cell write operations. This confinement results in high localized current densities in these volumes, and, in turn, in high ohmic heating. As a result, the magnitude of the switching current pulse can be reduced to a value that is compatible with modern integrated circuits.

These and other features and advantages of the present invention will become apparent from the following detailed description which is to be read in conjunction with the accompanying figures.

DETAILED DESCRIPTION OF THE INVENTION

This invention will be illustrated herein in conjunction with exemplary memory cells for use in integrated circuits and methods for forming such memory cells. It should be understood, however, that the invention is not limited to the particular materials, features, and processing steps shown and described herein. Modifications to the illustrative embodiments will become apparent to those skilled in the art.

Particularly with respect to processing steps, it is emphasized that the descriptions provided herein are not intended to encompass all of the processing steps which may be required to successfully form a functional integrated circuit device. Rather, certain processing steps which are conventionally used in forming integrated circuit devices, such as, for example, wet cleaning and annealing steps, are purposefully not described for economy of description. However one skilled in the art will readily recognize those processing steps omitted from these generalized descriptions.

In addition, when describing processing steps, details of those processing steps conventionally performed in the semiconductor processing art are omitted since these processes will be familiar to one skilled in that art. Moreover, many details of the processing steps used to fabricate the memory cells embodiments described herein may be found in a number of publications, for example, S. Wolf and R. N. Tauber, *Silicon Processing for the VLSI Era, Volume 1—Process Technology*, Lattice Press, 1986 and S. Wolf, *Silicon Processing for the VLSI Era, Volume 4—Deep Submicron Process Technology*, Lattice Press, 2002, both of which are incorporated herein by reference.

It should also be understood that the various layers and/or features shown in the accompanying figures are not drawn to scale, and that one or more layers and/or features of a type commonly used in integrated circuits may not be explicitly shown in a given figure. This does not imply that the layers and/or features not explicitly shown are omitted from the actual integrated circuit.

The term "phase change material" (PCM) as used herein is intended to encompass any material displaying more than one programmable electrical resistance state for use in integrated circuits. PCMs comprise, for example, various chalcogenides, transition metal oxides, and complex metal oxides which may include, for example, but are not limited to, doped or undoped GeSb, SbTe, $Ge_2Sb_2Te_5$ (GST), $SrTiO_3$, $BaTiO_3$, $(Sr,Ba)TiO_3$, $SrZrO_3$, $Ca_2Nb_2O_7$, $(Pr,Ca)MnO_3$, $Ta_2O_5$, $NiO_x$ and $TiO_x$, as well as other suitable materials.

Figure 1A:
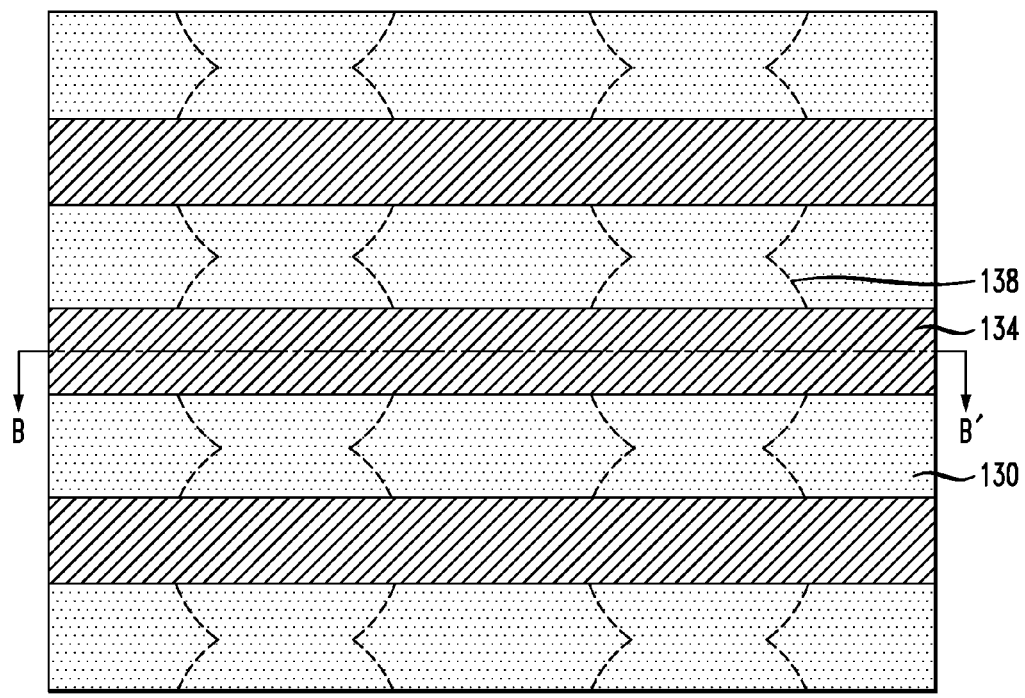
FIGS. 1A and 1B show plan and sectional views, respectively, of PCM-based memory cells in accordance with a first illustrative embodiment of the invention.
Figure 1B:
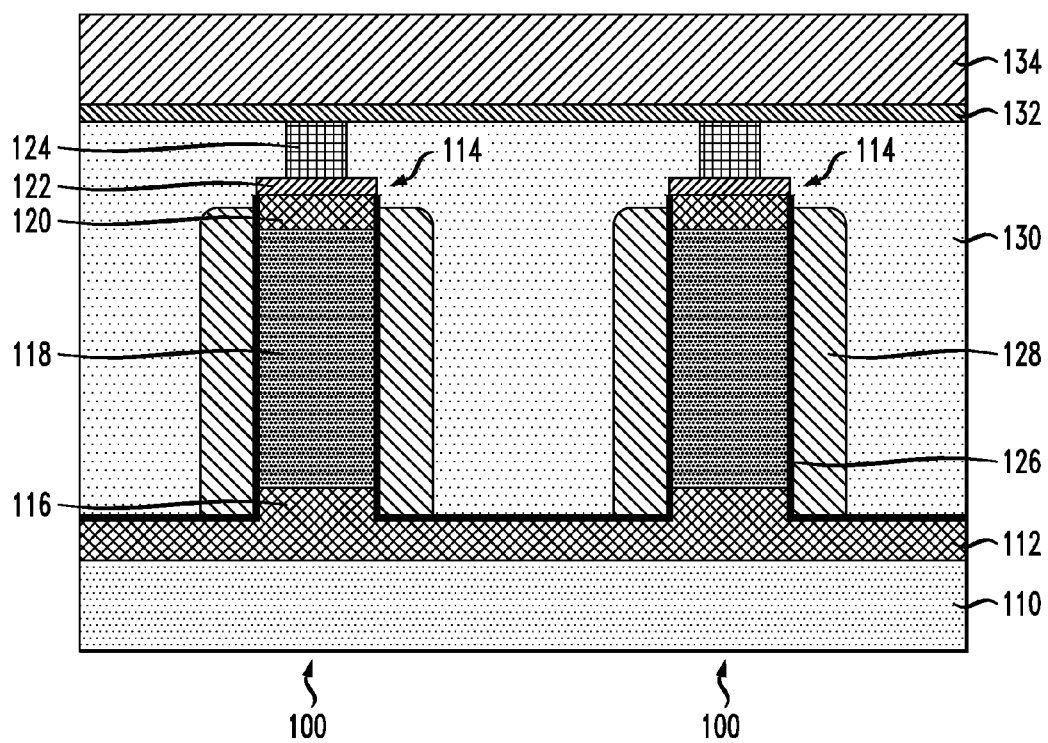
Figure 12:
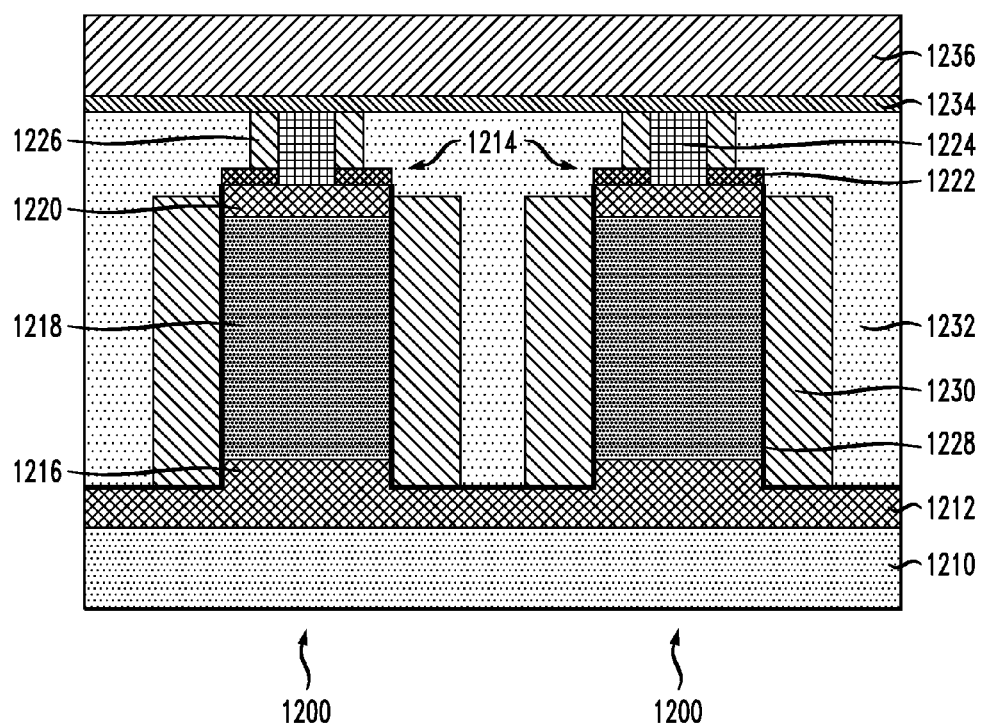
FIG. 12 shows a sectional view of PCM-based memory cells in accordance with a second illustrative embodiment of the invention.

The "depth direction of the memory cell" as used herein is intended to describe the direction from the uppermost feature of the memory cell to the lowermost feature of the memory cell as the memory cells are oriented in the accompanying sectional views (e.g., FIGS. 1B and 12).

FIGS. 1A and 1B show plan and sectional views, respectively, of completed PCM-based memory cells 100 in accordance with a first illustrative embodiment of the invention. More specifically, FIG. 1B shows a sectional view of the memory cells cut along the line B-B' indicated in FIG. 1A. All the memory cells are formed on a lower dielectric layer 110 and a lower electrode plate 112. Each memory cell comprises a memory cell island 114 rising above the lower electrode plate, which, in turn, comprises a lower doped feature 116, a middle doped feature 118, an upper doped feature 120, and a lower liner feature 122. PCM features 124 are formed on top of the islands, and each island is laterally surrounded by a gate dielectric feature 126 and a gate feature 128 (i.e., the gate feature overlies a portion of the island including the middle doped feature). The memory cell islands and PCM features are also laterally surrounded by an upper dielectric layer 130.

Reference to FIG. 1A shows that memory cells 100 in the direction of a row (i.e., the horizontal direction as depicted in the figure) also share a common upper liner feature 132 and upper electrode feature 134. The upper electrode features are the bitlines for the memory cells. Moreover, it will be observed that the memory cell-to-memory cell spacing is such that the gate features 128 of adjacent memory cells merge together in the direction of a column (i.e., the vertical direction as depicted in the figures). These merged gate features form the wordlines for the memory cells.

The lower doped features 116, the middle doped features 118, and the upper doped features 120 of the memory cells 100 in combination with the associated gate dielectric features 126 and the gate features 128 form vertical metal-oxide-semiconductor field effect transistors (MOSFETs). The lower doped features and the upper doped features form the source/drain regions of the MOSFETs while the middle doped features form the channel regions. If the vertical MOSFETs are to operate as n-type MOSFETs, the lower doped features and the upper doped features will preferably comprise silicon doped with a high concentration of an n-type dopant (e.g., $1\times10^{20}/cm^3$ concentration phosphorous) while the middle doped features will preferably comprise silicon doped with a lower concentration of a p-type dopant (e.g., $1\times10^{16}$ $cm^3$ concentration boron). The gate dielectric features preferably comprise silicon dioxide and the gate features preferably comprise doped polysilicon.

In terms of the other components of the memory cells 100, the lower dielectric layer 110 also preferably comprises silicon dioxide. In addition, the lower electrode plate 112 preferably comprises the same material as the lower doped features 116 (e.g., silicon doped with boron). The upper dielectric layer 130 preferably comprises silicon-carbon-hydroxide (SiCOH) which is a commonly used low-K dielectric material. The PCM features 124 preferably comprise GST, while the lower liner features 122 and the upper liner features 132 preferably comprise a conductive material that inhibits the interdiffusion of materials into and out of the PCM features. Examples may include, but are not limited to, titanium nitride (TiN), tantalum nitride (TaN), and tantalum silicon nitride (TaSiN). Finally, the upper electrode features 134 preferably comprise copper.

It should be noted, however, that the above-identified compositions are merely illustrative and that several other material combinations are contemplated and would come within the scope of the invention. Therefore, the above-identified composition choices should not be construed as limiting the scope of the invention.

Storing data in a particular memory cell 100 (the "selected memory cell") comprises placing some portion of the total volume of the PCM feature 124 (the "switchable volume") for that memory cell into either a lower electrical resistance polycrystalline state or a higher electrical resistance amorphous state. Transitions between these states are accomplished by heating the switchable volume of the PCM by applying a pulse of switching current to the selected memory cell and then allowing the volume of PCM to rapidly cool. The pulse of switching current maybe applied by first using support circuitry (not explicitly shown) to apply a voltage difference between the lower electrode plate 112 and the upper electrode feature 134 (bitline) associated with the selected memory cell. Additional support circuitry is then used to apply a voltage to the column of merged gate features 122 (wordline) associated with the selected memory cell such that the vertical MOSFET of the selected cell is turned on. In other words, the gate voltage produces a relatively lower resistance, conductive channel in the middle doped feature 118 of the selected memory cell between the lower and upper doped features 116, 120. Once this is accomplished, the voltage difference on the lower electrode plate and the upper electrode feature can cause a current to pass through the memory cell, including the PCM feature.

The duration of the switching current pulse is preferably between about one and about 500 nanoseconds and has a fast falling edge (i.e., less than about ten nanoseconds). The fast falling edge acts to freeze the switchable volume of the PCM in its current electrical resistance state without allowing additional time for the bonds within the material to continue to rearrange.

Subsequently, reading the state of the selected memory cell 100 is accomplished by using support circuitry to apply a sensing voltage to the memory cell, again via the lower electrode plate 112, the upper electrode feature 134 (bitline) associated with the selected memory cell, and the merged gate features 128 (wordline) associated with the selected memory cell. The ratio of the electrical resistances between the higher and lower electrical resistance states in a typical PCM is between 10:1 and 1,000:1. The sensing voltage between the lower electrode plate and the upper electrode feature is preferably of low enough magnitude to provide negligible ohmic heating in the PCM feature 124. Accordingly, the electrical resistance state of the PCM can be determined in this manner without disturbing its written electrical resistance state. Data integrity is thereby maintained while reading the data.

The support circuitry necessary to accomplish the above-described write and read functions may include conventional column/row select circuitry, voltage-drivers, and sense-amplifiers that are connected to the lower electrode plate 112, the upper electrode features 134 (bitlines), and the merged gate features 128 (wordlines). Because of their conventional nature, these elements will be familiar to one skilled in the art and are not described further herein Advantageously, the constricted shape of the PCM features 124 relative to the rest of the memory cell islands 114 in the memory cells 100 acts to force applied switching currents to pass through confined volumes of PCM during write operations. This confinement results in high localized current densities in these volumes, and, in turn, in high ohmic heating. As a result, the memory cell design shown in FIGS. 1A and 1B provides high localized switching current density so that the magnitude of a switching current pulse can be reduced to a value that is compatible with modern integrated circuits.

One will also note that the memory cells 100 in FIGS. 1A and 1B may be implemented such that each memory cell occupies an area of about $4F^2$ (where F is the minimum lithographic dimension). Of course, such a small area is extremely advantageous in terms of memory capacity, power consumption, and the cost of memory production.

FIGS. 2A-11B show plan and sectional views of the memory cells 100 in FIGS. 1A and 1B during various stages in their formation. More specifically, the "A" figures show plan views while the "B" figures show sectional views cut along the lines indicated in the "A" figures.

Figure 2A:
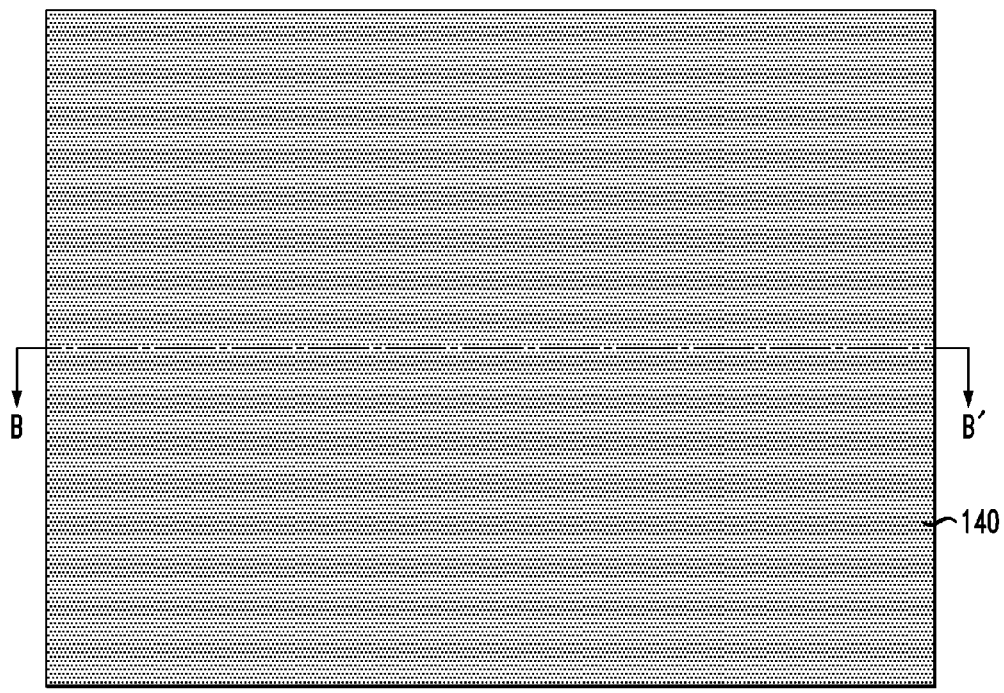
FIGS. 2A-11B show plan and sectional views of the memory cells in FIGS. 1A and 1B during various stages in their formation.
Figure 2B:
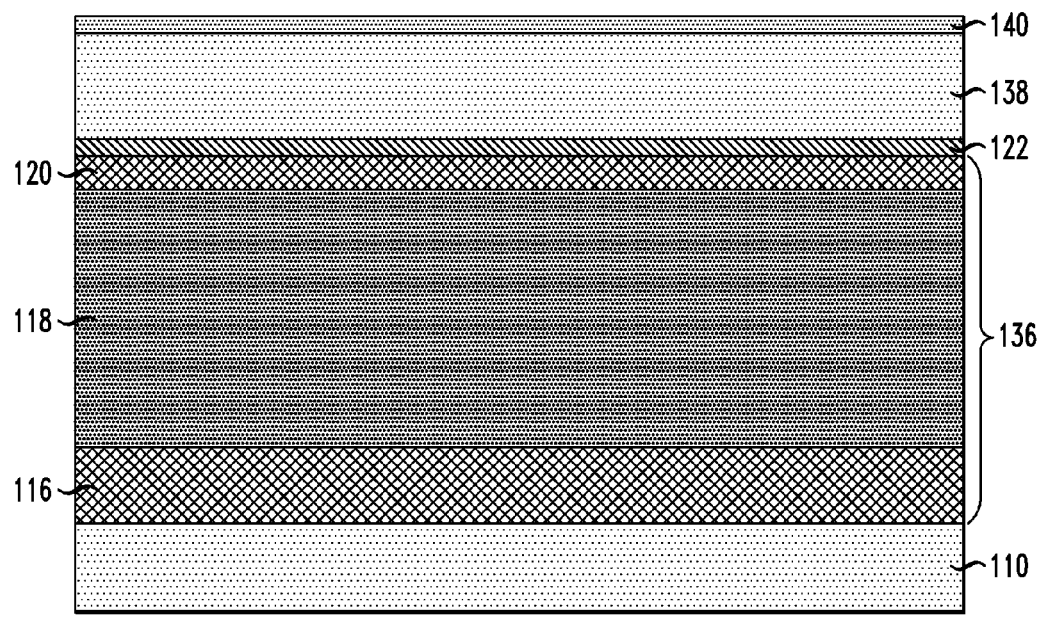

FIGS. 2A and 2B, for example, show the initial film stack in which the memory cells 100 will be formed. A layer of silicon 136 is formed on the lower dielectric layer 110. The silicon layer comprises three doped regions 116, 118, and 120 that will eventually be patterned into discrete memory cell islands 114. A layer of lower liner feature material 122 is disposed on the silicon layer. A sacrificial layer 138 and a mask layer 140 are disposed on this lower liner feature layer. The sacrificial layer preferably comprises silicon dioxide and the mask layer preferably comprises silicon nitride, although in either case, other suitable materials may be chosen.

The initial film stack may be formed in various ways. The layer of silicon 136 may, for example, be initially ion implanted to form the doped regions 116, 118, 120 and then bonded to a separate silicon dioxide substrate so that the lower dielectric layer 110 is provided below the memory cells 100. Subsequently, the uppermost layers 132, 138, 140 may be deposited on the layer of silicon. Nonetheless, this is just one possible manner in which the initial film stack may be formed. Other methods may include, for example, growing silicon on a silicon dioxide substrate in order to avoid the step of bonding separate substrates together. Such alternative methods, as well as their combinations, would come within the scope of this invention.

Figure 3A:
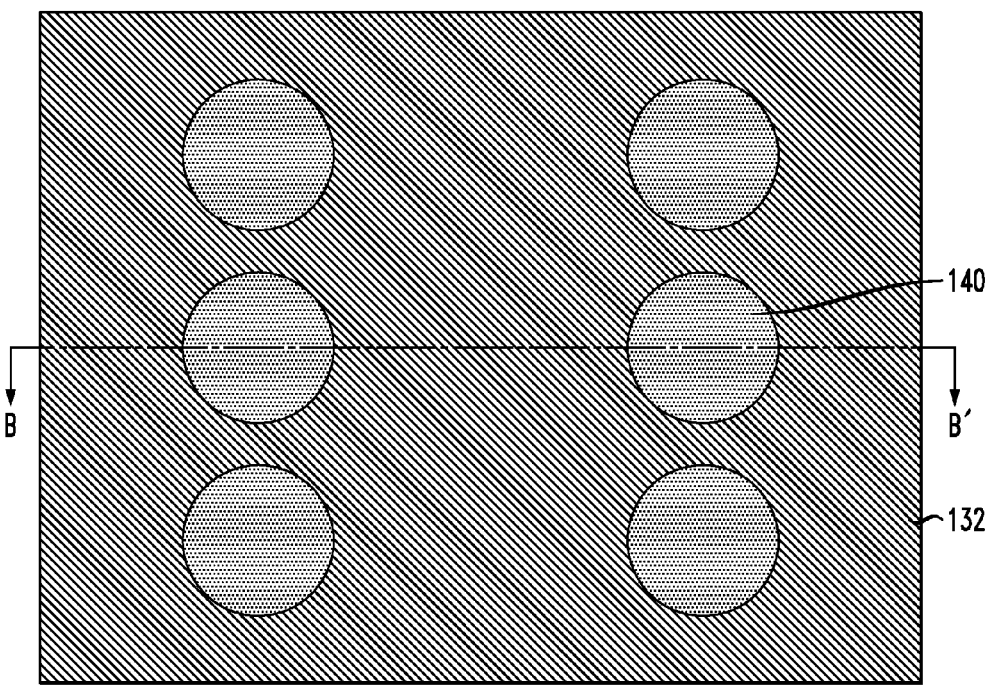
Figure 3B:
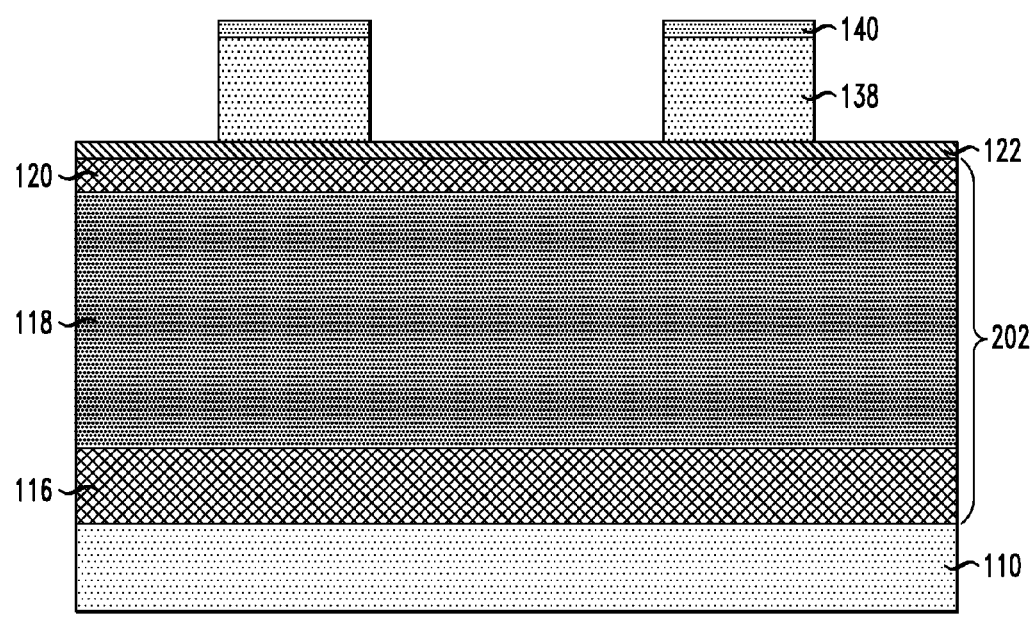

Once the initial film stack is formed, conventional photolithography and anisotropic etching (e.g., reactive ion etching (RIE)) may be used to pattern the mask layer 140 and sacrificial layer 138 into discrete features that cover those areas of the lower liner feature layer 122 and the silicon layer 136 where memory cells 100 are desired. This configuration is shown in FIGS. 3A and 3B. In the particular embodiment described herein, the sacrificial layer features and mask layer features are patterned such that they have circular shapes when considered top-down (i.e., when considered in a plane perpendicular to the depth direction of the memory cells). This will ultimately produce circular memory cell islands 114. However, this particular shape is merely illustrative and other suitable shapes may be utilized. It may, for example, be advantageous to pattern the features so that they are shaped like squares or other parallelograms (e.g., rectangles).

Figure 4A:
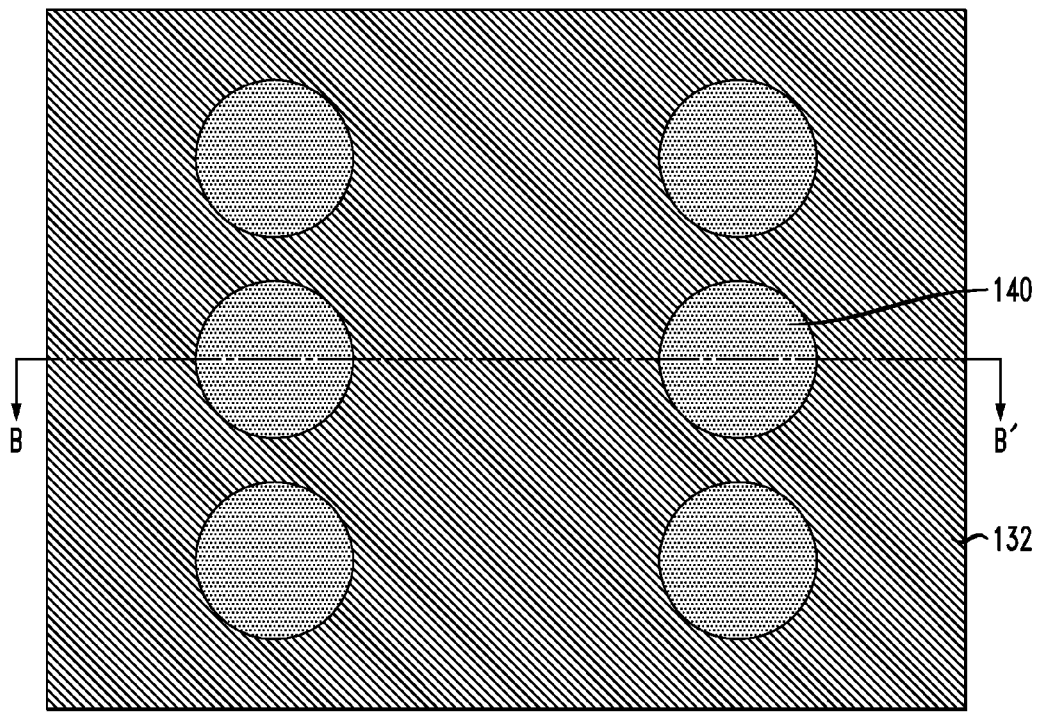
Figure 4B:
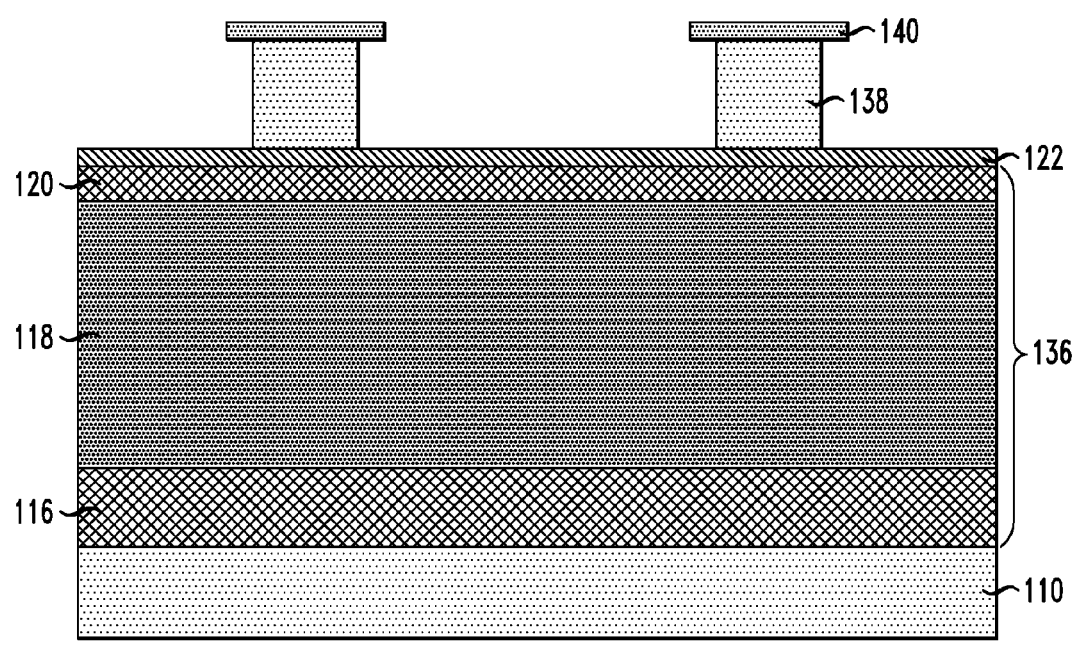

At the point in the process described in FIGS. 3A and 3B, the sacrificial layer features 138 and mask layer features 140 may be substantially larger in diameter than the desired memory cell islands 114. After forming these features, a trimming step may be used to reduce the lateral size of the sacrificial layer features to dimensions smaller than that of the mask layer features. The results of this "trimming" step are shown in FIGS. 4A and 4B. If the sacrificial layer features comprise silicon dioxide and the mask layer features comprise silicon nitride, the trimming may be accomplished by, for example, selectively etching the sacrificial layer features using a gaseous mixture of hydrofluoric acid and ammonia. Such a process is described in, e.g., U.S. Pat. No. 6,790,733 to Natzle et al., entitled "Preserving TEOS Hard Mask Using COR for Raised Source-Drain Including Removable/Disposable Spacer," which is incorporated herein by reference. This process is frequently called "Chemical Oxide Removal" (COR). Alternatively, wet chemical etchants may be utilized to trim the sacrificial layer features. Once the trimming step is completed, the sacrificial layer features may have lateral dimensions substantially smaller than those that are readily achieved using conventional photolithography techniques.

Figure 5A:
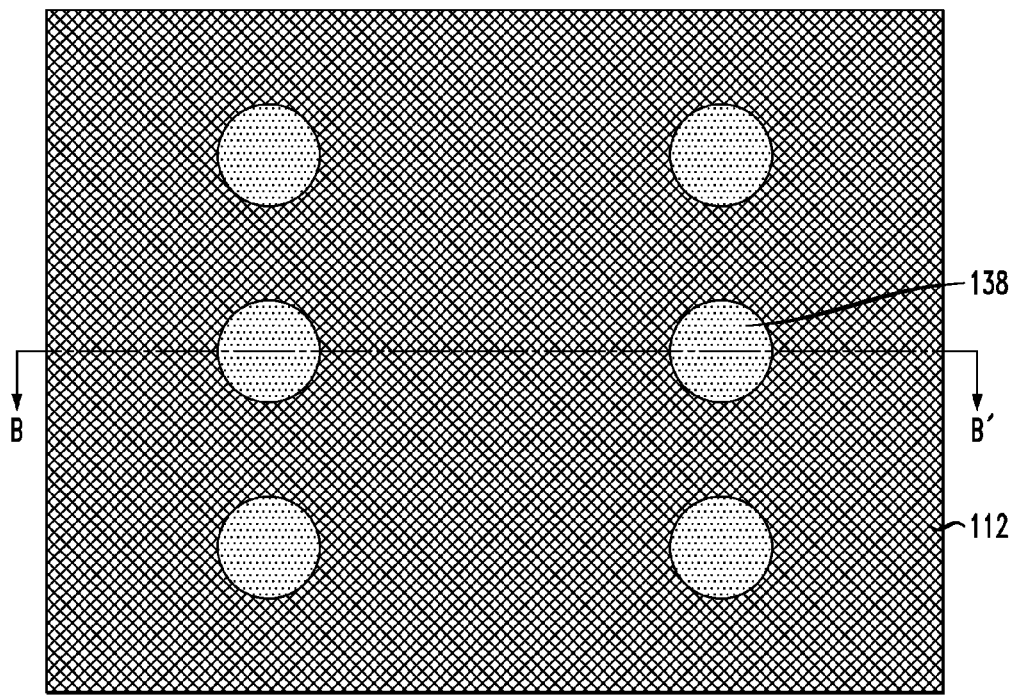
Figure 5B:
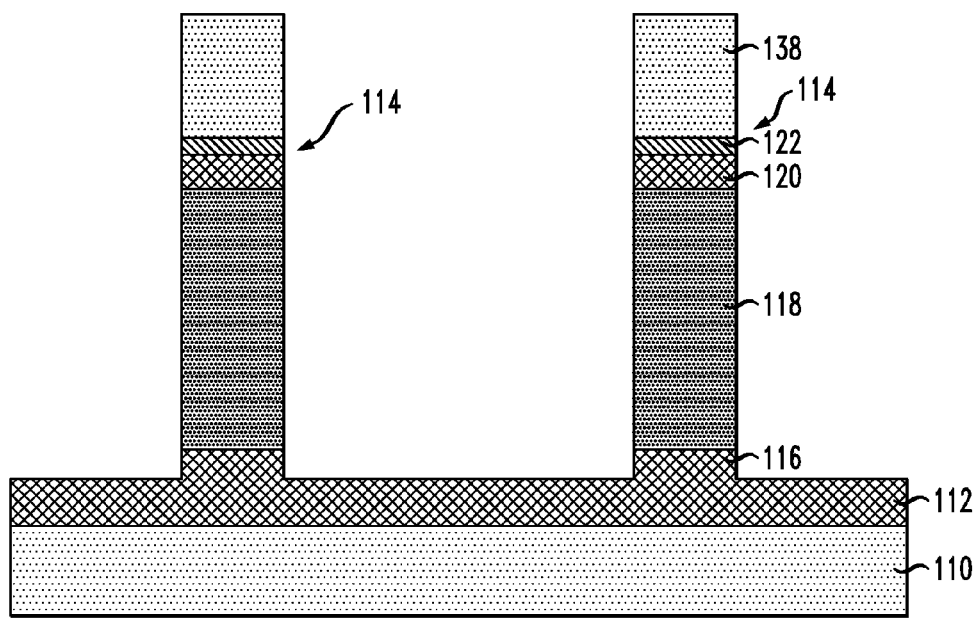

After the trimming process, the sacrificial layer features 138 preferably have diameters approximately equal to the diameters desired for the memory cell islands 114. The mask layer features 140 may then be selectively removed from the tops of the sacrificial layer features, and the sacrificial layer features used as hard masks to anisotropically etch the memory cell islands 114. The results of such patterning are shown in FIGS. 5A and 5B. One will notice that the anisotropic etch process has been allowed to proceed to such an extent that the bottommost doped region of the layer of silicon 136 has been patterned into what is referred to herein as the lower doped features 116 and the lower electrode plate 112.

Figure 6A:
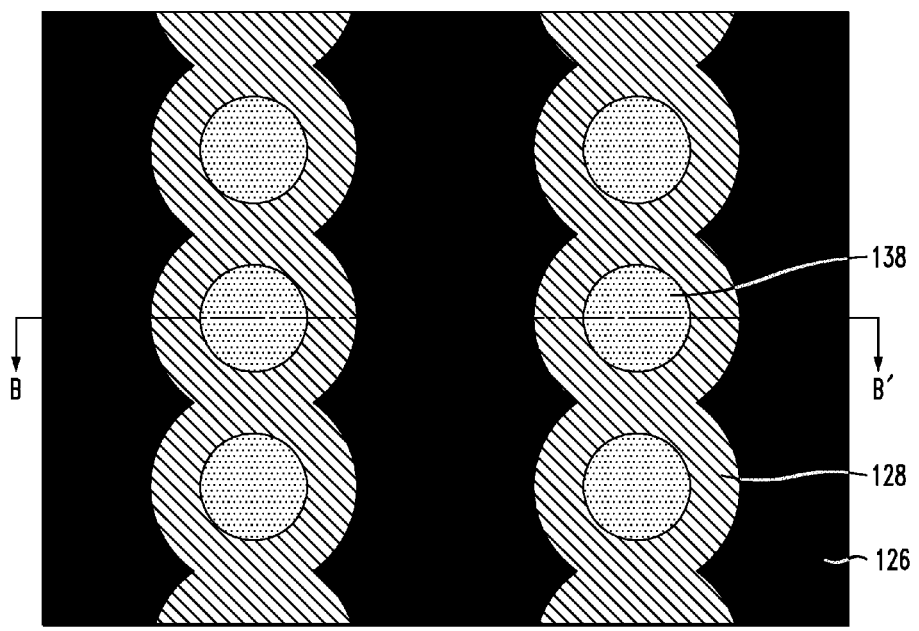
Figure 6B:
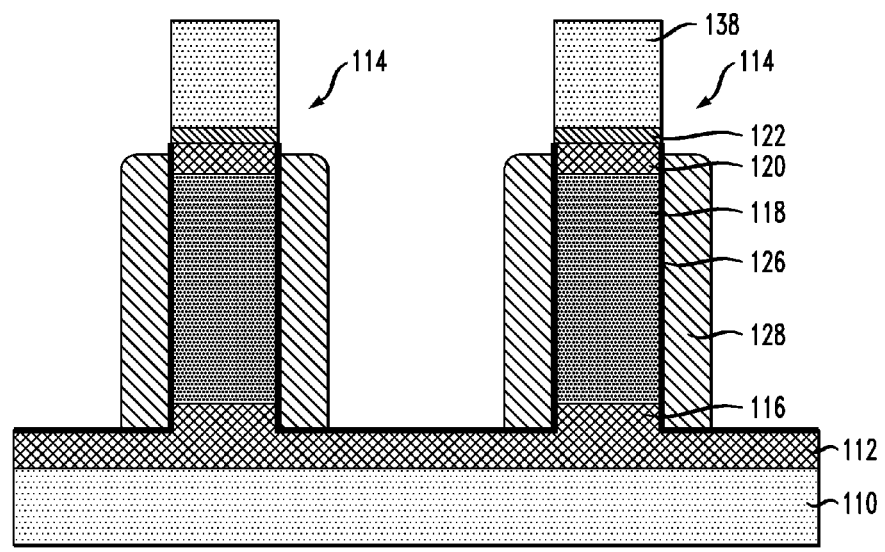

Subsequently, conventional oxidation techniques may be used to form the gate dielectric features 126 on the sidewalls of the memory cell islands 114. Next, a layer of gate feature material is blanket deposited on the film stack and anisotropically etched so that the material is removed from all the horizontal surfaces of the film stack and only remains on the sidewalls of the memory cell islands. The gate features 128 are thereby formed, as shown in FIGS. 6A and 6B. Because of the asymmetric layout, the gate features are allowed to merge in the direction of a column to form continuous wordlines.

Figure 7A:
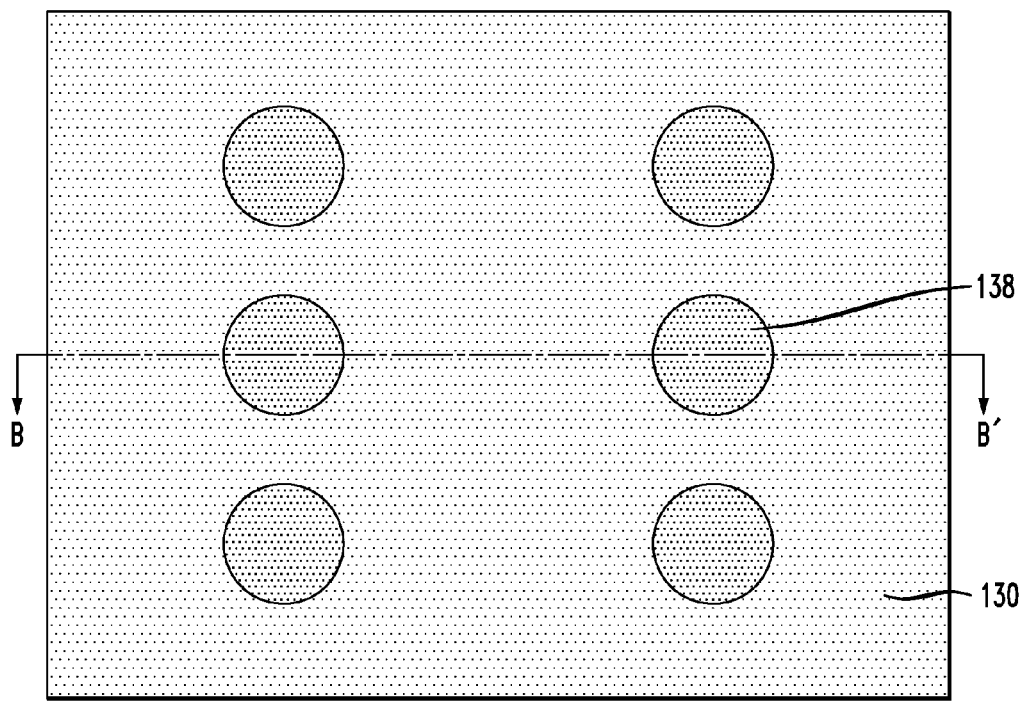
Figure 7B:
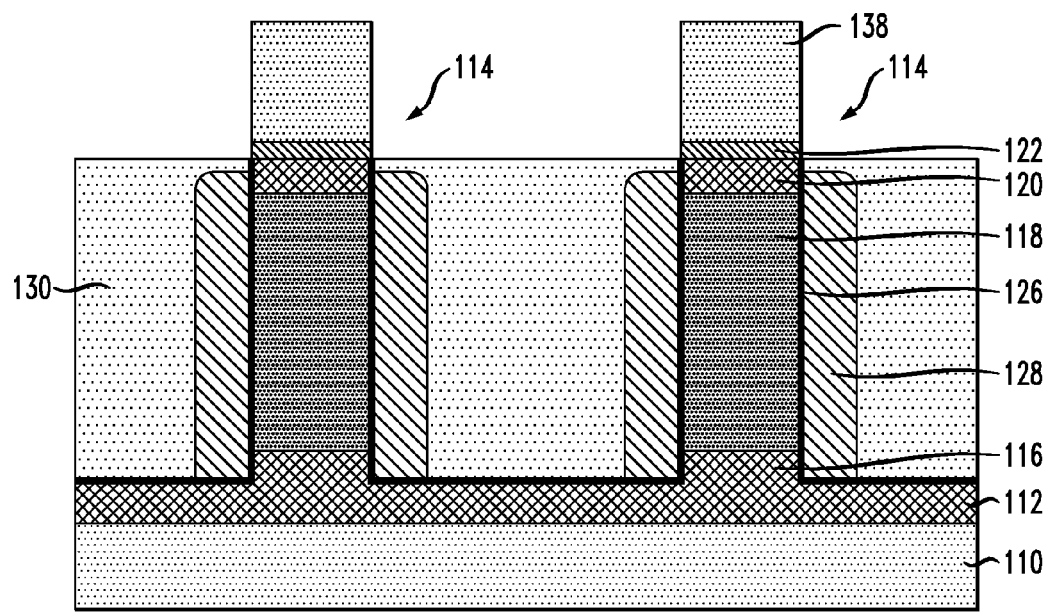
Figure 8A:
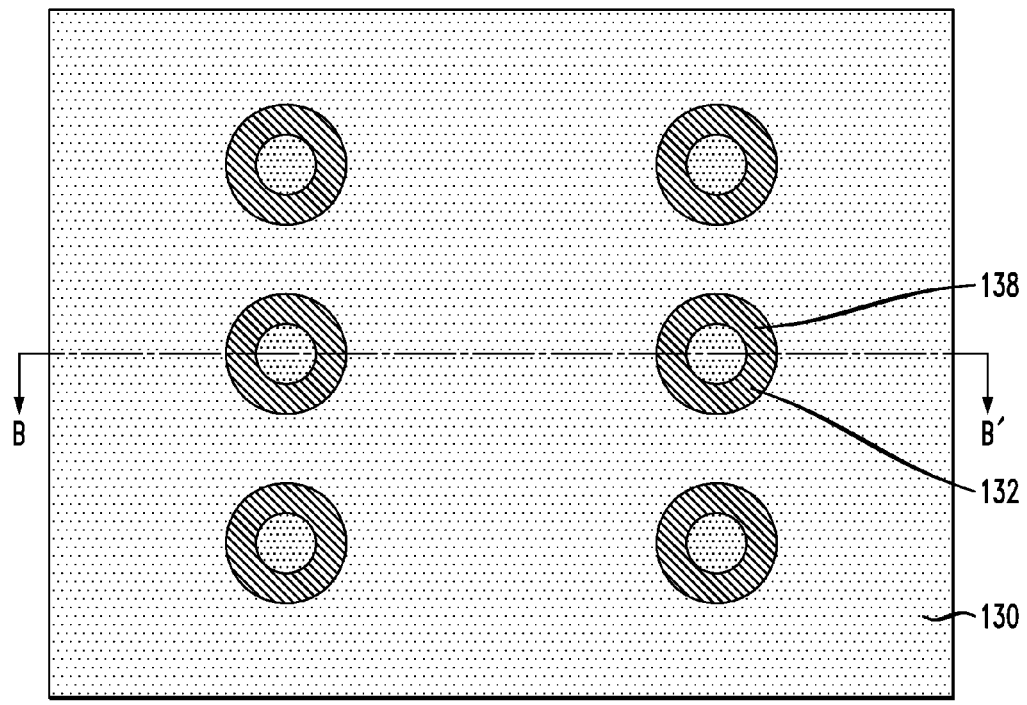
Figure 8B:
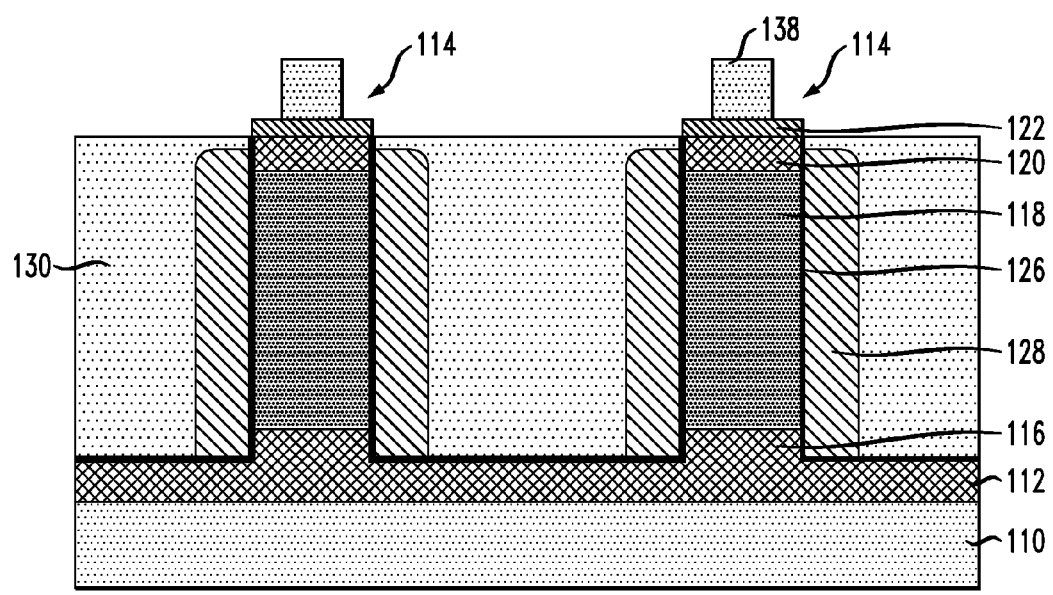

In further processing, a layer of material for the upper dielectric layer 130 is deposited on the film stack, planarized using, for example, chemical mechanical polishing (CMP), and selectively anisotropically etched to form the film stack shown in FIGS. 7A and 7B. Additional etching is then used to selectively reduce the size of the now-exposed sacrificial layer features 138. In other words, the sacrificial layer features are effectively trimmed for a second time, this time to set the size of the features to the intended size of the PCM features 124. In this way, the sacrificial features may be trimmed to have a minimum dimension in a plane perpendicular to the depth direction of the memory cells which is substantially smaller than that of the memory cell islands 114. This second trimming step preferably does not etch the upper dielectric layer or the exposed lower liner features 122, or alternatively, only etches these features relatively slowly. If the sacrificial layer features comprise silicon dioxide and the upper dielectric layer comprises SiCOH, such a process may be accomplished again with, for example, a COR process like that described in U.S. Pat. No. 6,790,733 (cited above). The film stack after this second trimming process is shown in FIGS. 8A and 8B.

Figure 9A:
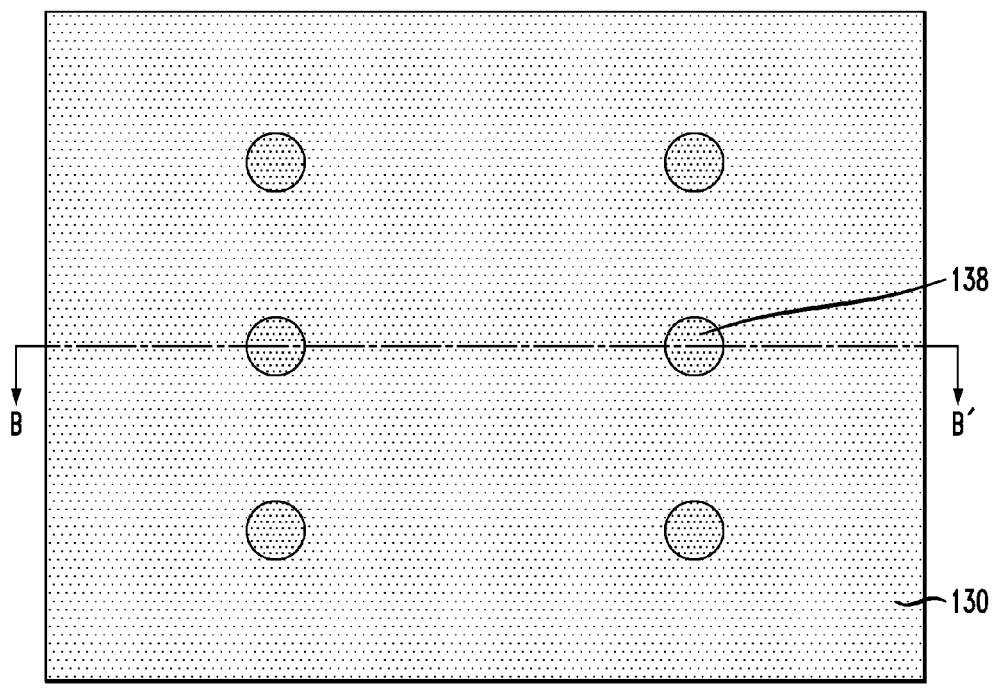
Figure 9B:
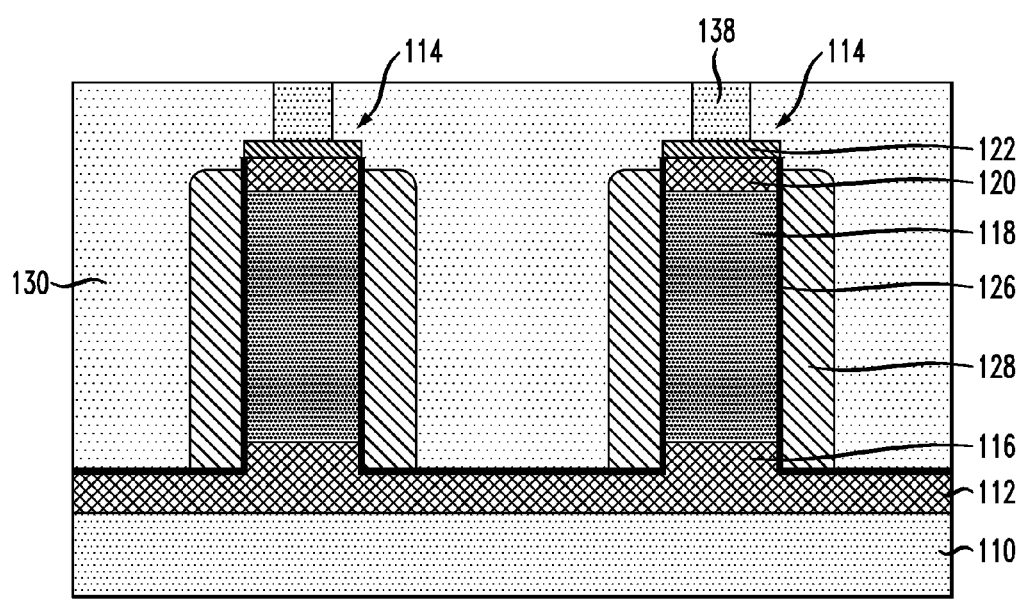
Figure 10A:
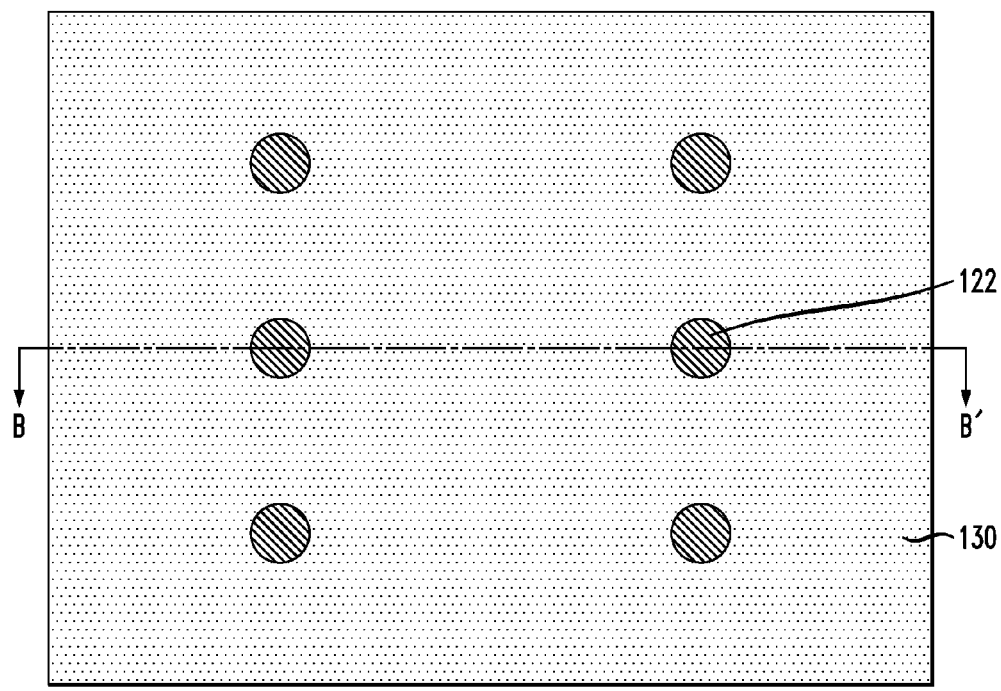
Figure 10B:
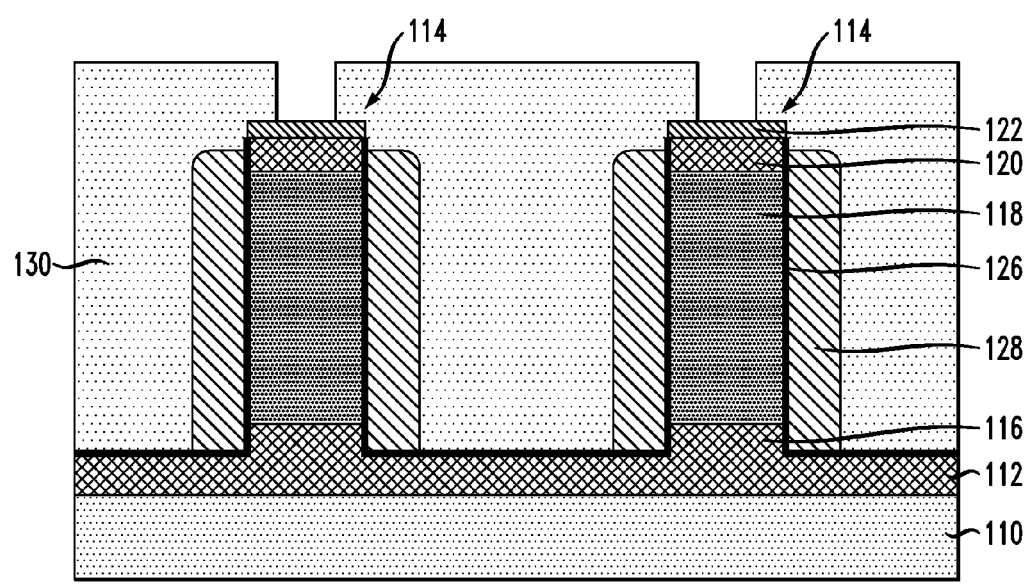

At this point in the process, an additional layer of material for the upper dielectric layer 130 may be deposited and planarized such that only the tops of the sacrificial layer features 138 are exposed. This processing completes the formation of the upper dielectric layer and is shown in FIGS. 9A and 9B. The sacrificial layer features 138 may then be replaced with PCM to form the PCM features 124. The sacrificial features are first selectively removed leaving spaces for the PCM features above the memory cell islands 114. This step may be accomplished using a COR process similar to that described immediately above. The result of removing the sacrificial layer features is shown in FIGS. 10A and 10B. Once the sacrificial layer features are removed, the PCM features may be formed by first blanket depositing PCM over the film stack such that it fills the holes in the upper dielectric layer and then planarizing the PCM such that PCM is removed from the upper surface of the upper dielectric layer. The resultant film stack is shown in FIGS. 11A and 11B.

Figure 11A:
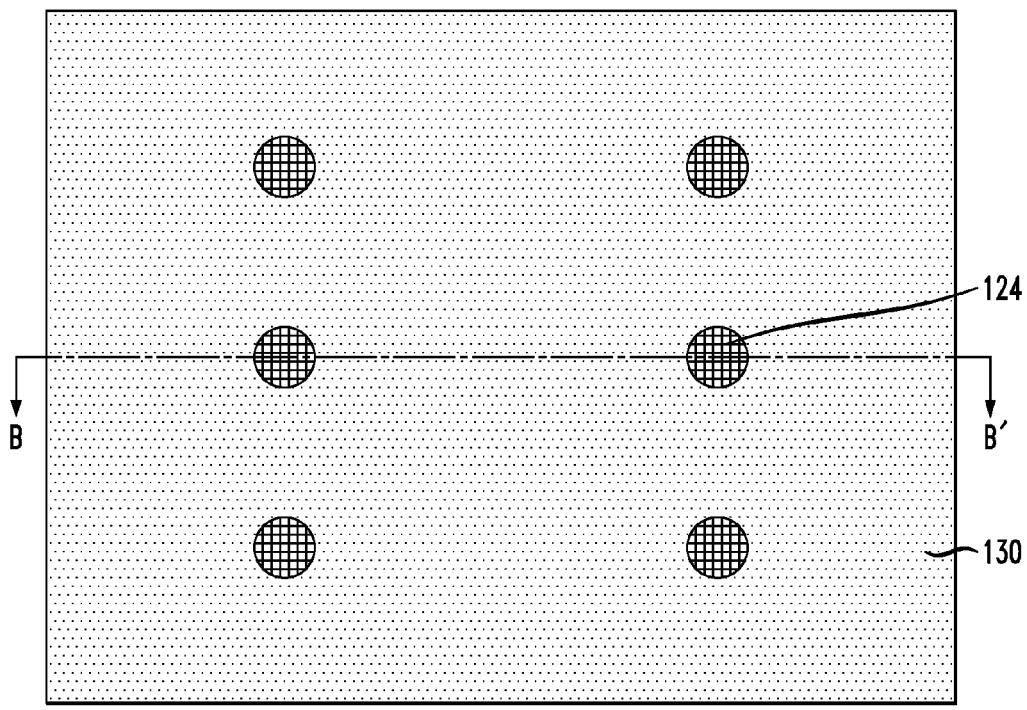
Figure 11B:
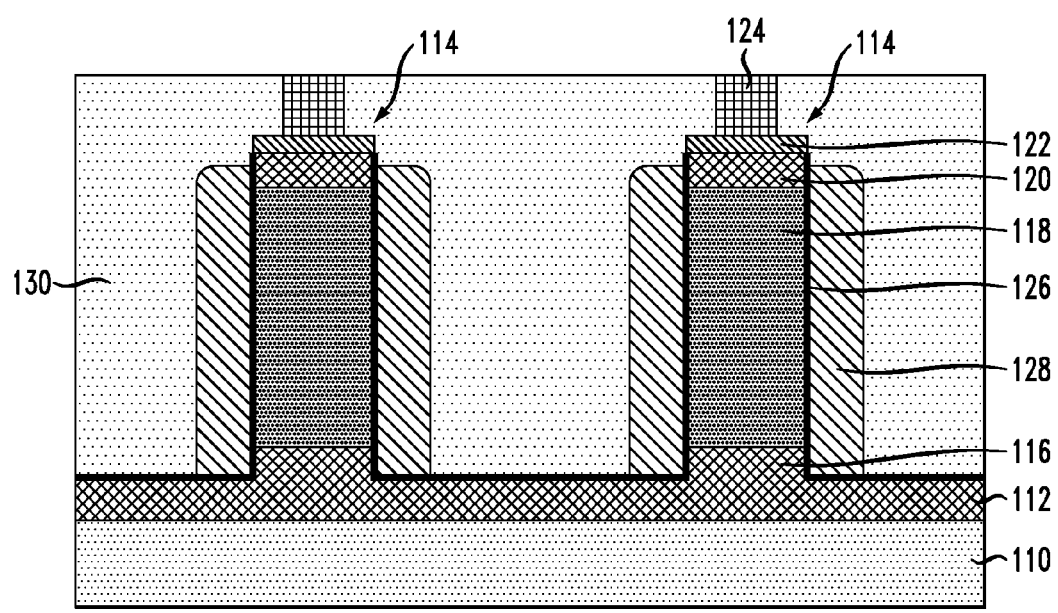

Once the film stack is formed to the point shown in FIGS. 11A and 11B, forming the film stack shown in FIGS. 1A and 1B simply becomes a matter of forming the upper liner features 132 and upper electrode features 132 to form the bitlines. Such a process can be accomplished by depositing layers for each of these features and then using conventional photolithography and anisotropic etching to pattern the intended lines.

The above-described method of forming the memory cells 100 has a number of advantages. Although consisting of a novel and non-obvious sequence of processing steps, the method may, for example, be implemented using conventional and commercially available semiconductor processing equipment. In addition, the two trimming steps used to modify the sizes of the sacrificial layer features 138 allow the memory cell islands 114 and PCM features 124 to have lateral sizes substantially smaller than that easily achieved using conventional photolithography techniques (i.e., the PCM features may have a minimum dimension in a plane perpendicular to the depth direction of the memory cells that is less than a prescribed minimum lithographic dimension). The sizes of the memory cell islands and the PCM features are also independently adjustable relative to one another.

Moreover, the illustrative method allows the PCM features 124 to be self-aligned to their respective memory cell islands 114. Such a self-aligned process may be substantially superior to one that relies on separate photolithography steps to produce the memory cell islands and the PCM features. Using separate photolithography steps will typically produce overlay errors between these features and may require that the memory cell islands be made larger in order to avoid issues with PCM features that miss or do not fully land on their respective memory cell islands. Photolithography steps are also relatively expensive when compared to other processing steps. Therefore, replacing a photolithography step with a self-aligned process frequently reduces the total cost of producing an integrated circuit.

FIG. 12 shows a sectional view of PCM-based memory cells 1200 in accordance with a second illustrative embodiment of the invention. All the memory cells are formed on a lower dielectric layer 1210 and a lower electrode plate 1212. Each memory cell comprises a memory cell island 1214 rising above the lower electrode plate, which, in turn, comprises a lower doped feature 1216, a middle doped feature 1218, an upper doped feature 1220, and a lower liner feature 1222. PCM features 1224 are formed in openings in the lower liner features and on top of the upper doped features. The PCM features are laterally surrounded by fill layer features 1226, while each island is laterally surrounded by a gate dielectric feature 1228 and a gate feature 1230. The memory cell islands and the fill layer features are also laterally surrounded by a middle dielectric layer 1232.

In a manner similar to the memory cells 100 in FIGS. 1A and 1B, the memory cells 1200 are arranged in rows and columns. Memory cells in a given row share a common upper liner feature 1234 and upper electrode feature 1236. The upper electrode features are the bitlines for the memory cells. Memory cell spacing is also such that the gate features 1230 of adjacent memory cells in a given column merge together to form wordlines for the memory cells.

The lower doped features 1216, the middle doped features 1218, and the upper doped features 1220 of the memory cells 1200 in combination with the associated gate dielectric features 1228 and the gate features 1230 form vertical MOSFETs. As before, the gate dielectric features preferably comprise silicon dioxide and the gate features preferably comprise polysilicon. The lower dielectric layer 1210 and the middle dielectric layer 1232 preferably comprise silicon dioxide, while the lower electrode plate 1212 preferably comprises the same material as the lower doped features 1216 (e.g., silicon doped with phosphorous). The PCM features 1224 preferably comprise GST, while the lower liner features 1222 preferably comprise silicon nitride. Finally, the upper liner features 1234 preferably comprise TiAlN or WTiO, and the upper electrode features 1236 preferably comprise copper. Nevertheless, as was the case above, these compositions are merely illustrative and several other material combinations are contemplated and would come within the scope of the invention. Therefore, the above-identified composition choices should not be construed as limiting the scope of the invention.

Reading and writing to the memory cells 1200 is accomplished in a manner similar to that described earlier for the memory cells 100. Moreover, as before, the constricted volumes of PCM in the PCM features 1224 allow the memory cells 1200 to require lower write currents.

Figure 13:
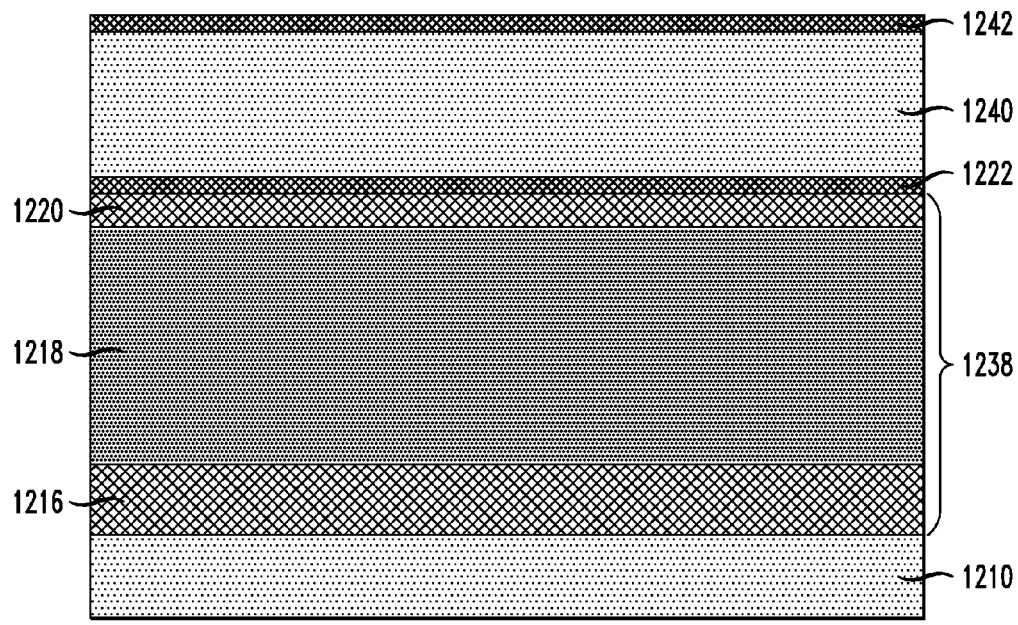
FIGS. 13-19 shows sectional views of the FIG. 12 memory cells during various stages in their formation.

FIGS. 13-19 show sectional views of the memory cells 1200 during various stages in their formation. FIG. 13, for example, shows the initial film stack in which the memory cells 1200 will be formed. A silicon layer 1238 is formed on the lower dielectric layer 1210. The silicon layer comprises three doped regions corresponding to the lower, middle, and upper doped features 1216, 1218, 1220 in the final memory cells. A layer of lower liner feature material 1222 is disposed on the silicon layer. An upper dielectric layer 1240 and a mask layer 1242, in turn, are disposed on top of the layer of lower liner feature material. The upper dielectric layer preferably comprises silicon dioxide and the mask layer preferably comprises silicon nitride, although other suitable materials may be chosen. As before, the initial film stack may be formed by bonding different substrates together or by alternative methods that will be familiar to one skilled in the art.

Figure 14:
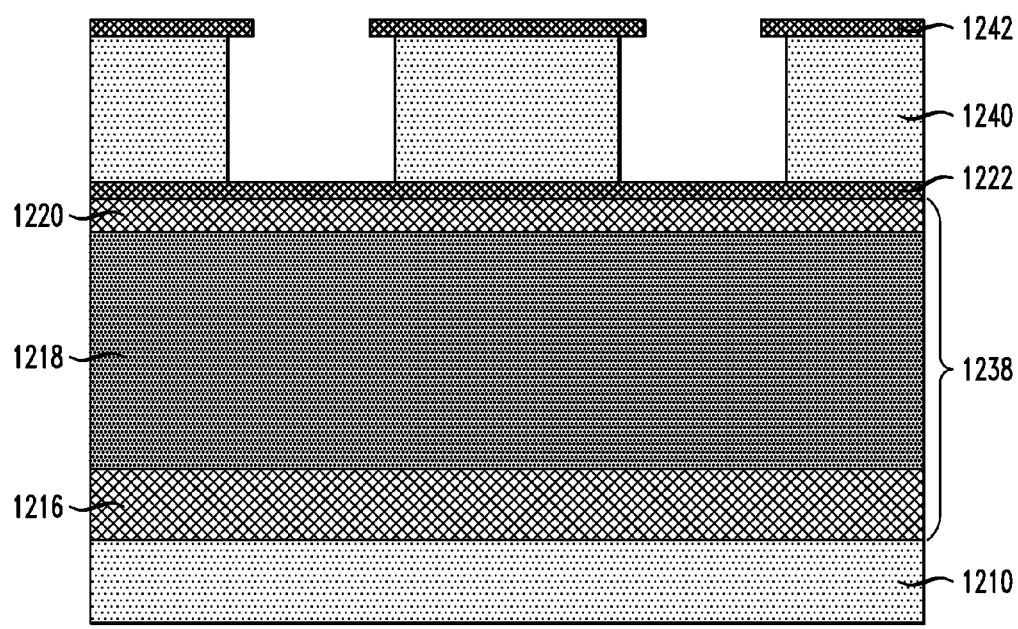

Once the initial film stack is formed, conventional photolithography and anisotropic etching (e.g., RIE) may be used to pattern the mask layer 1242 and upper dielectric layer 1240 to form holes in these layers where memory cells are ultimately desired. Circular holes are used to form circular memory cell islands 1214. The upper dielectric layer may then be selectively pulled back using, for example, COR or wet chemical etchants. This causes the mask layer to overhang the holes in the upper dielectric layer, as shown in FIG. 14.

Figure 15:
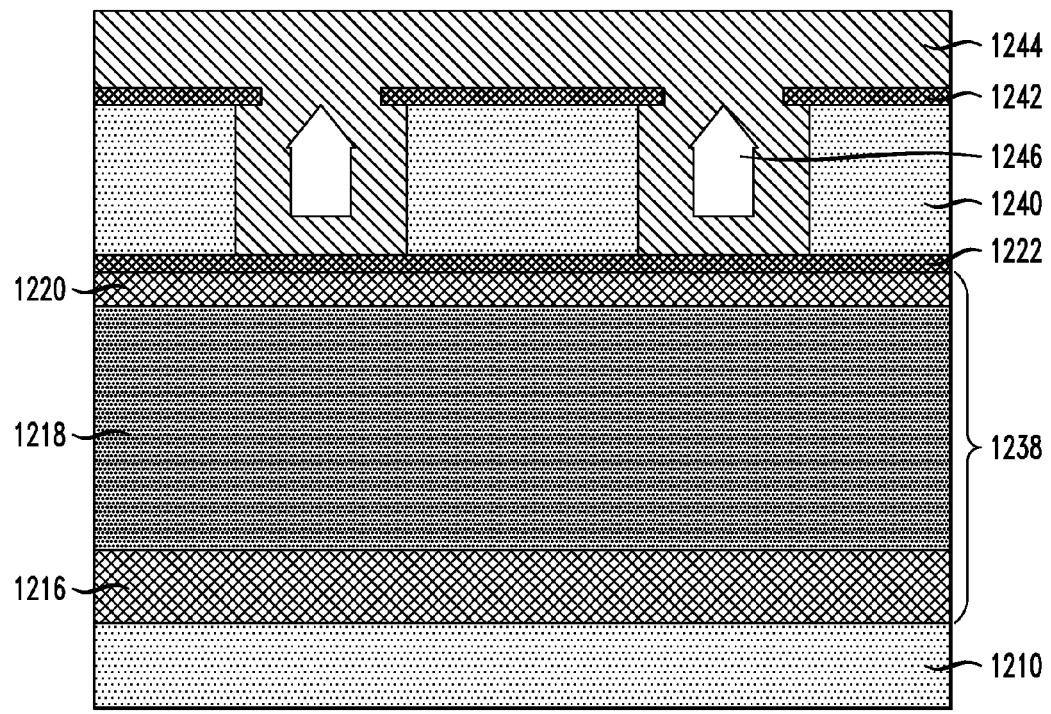
Figure 16:
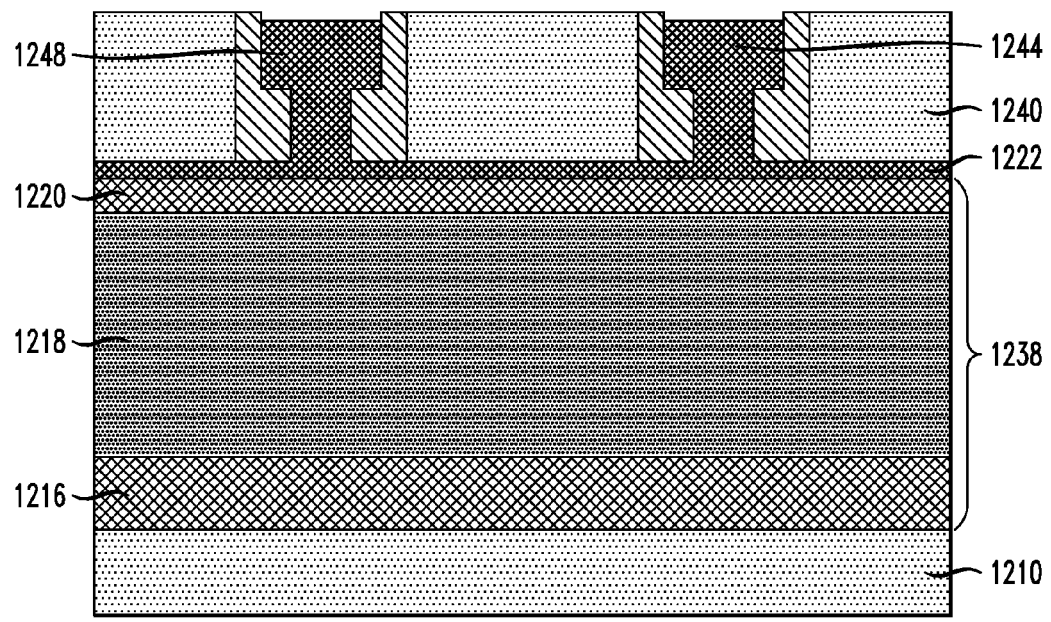

Subsequently, the film stack is exposed to a blanket deposition of a fill layer 1244 preferably using a deposition method that allows the film layer material to deposit in a substantially isotropic manner, as shown in FIG. 15. The fill layer may, for example, comprise intrinsic, nonconducting polysilicon and the method of deposition may comprise chemical vapor deposition. One skilled in the art will recognize that the simultaneous deposition of the fill layer material on all the exposed surfaces of the film stack, in combination with the overhang created by the mask layer 1242, will tend to cause voids 1246 to form in the fill layer features located in the holes in the upper dielectric layer 1240. Formation of these voids is intentional as will be seen below. The voids will tend to be centered in the holes and surrounded on all sides by the fill layer material.

The film stack is then exposed to an anisotropic etch process that selectively etches the fill layer 1244 without etching the mask layer 1242. Because of this selectivity, the mask layer acts as a hard mask during the etch process. The anisotropic etch is allowed to proceed until the fill layer is first removed from the top of the lower liner feature layer 1222. Because of the voids 1246 in the fill layer, this will occur immediately under the voids. A blanket deposition of a sacrificial layer 1248 is then deposited on the film stack so that it enters the newly formed holes in the now-discrete fill layer features. The sacrificial layer preferably comprises the same material as the lower liner features, such as, for example, silicon nitride. The sacrificial layer is then selectively removed from the top of the film stack using another anisotropic etch process and/or planarization process. The mask layer is also removed during this process, resulting in the film stack shown in FIG. 16.

Figure 17:
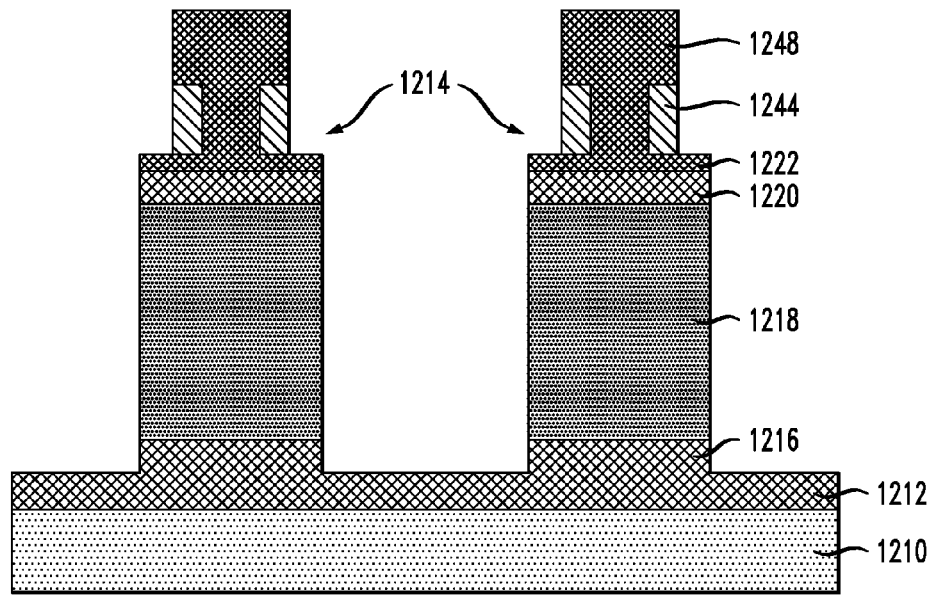

The memory cell islands 1214 are then patterned using a conventional anisotropic etch process with portions of the lower liner feature layer 1222 acting as a hard mask. This is accomplished by first selectively etching the upper dielectric layer 1240 and then etching those portions of the lower liner feature layer immediately underlying the just-removed upper dielectric layer portions. As before the memory cell island etch is allowed to proceed into the lowermost doped region of the silicon layer 1238 in order to pattern the lower doped features 1216 and the lower electrode plate 1212. This etch also removes the fill layer that does not underlie the sacrificial layer features 1248, as shown in FIG. 17.

Figure 18:
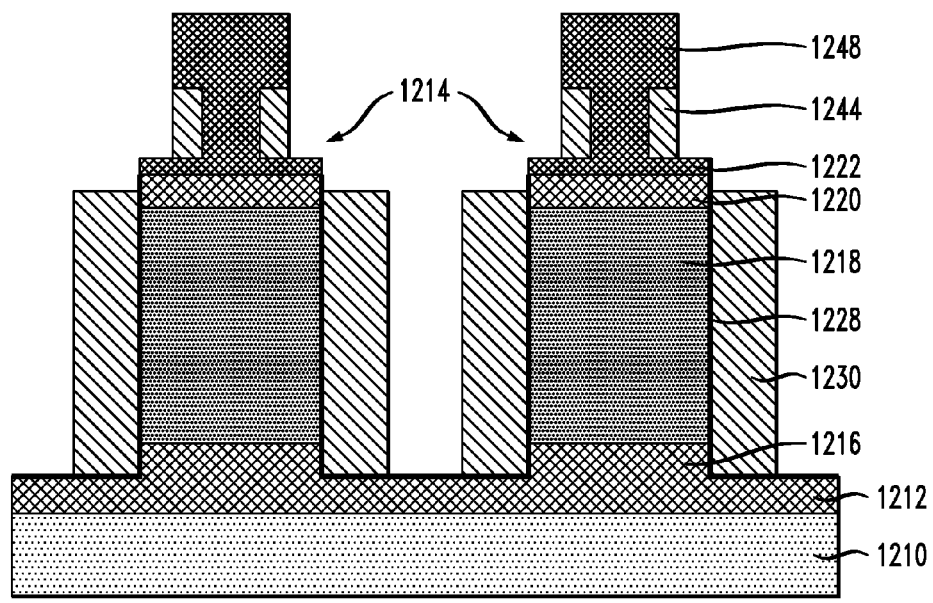
Figure 19:
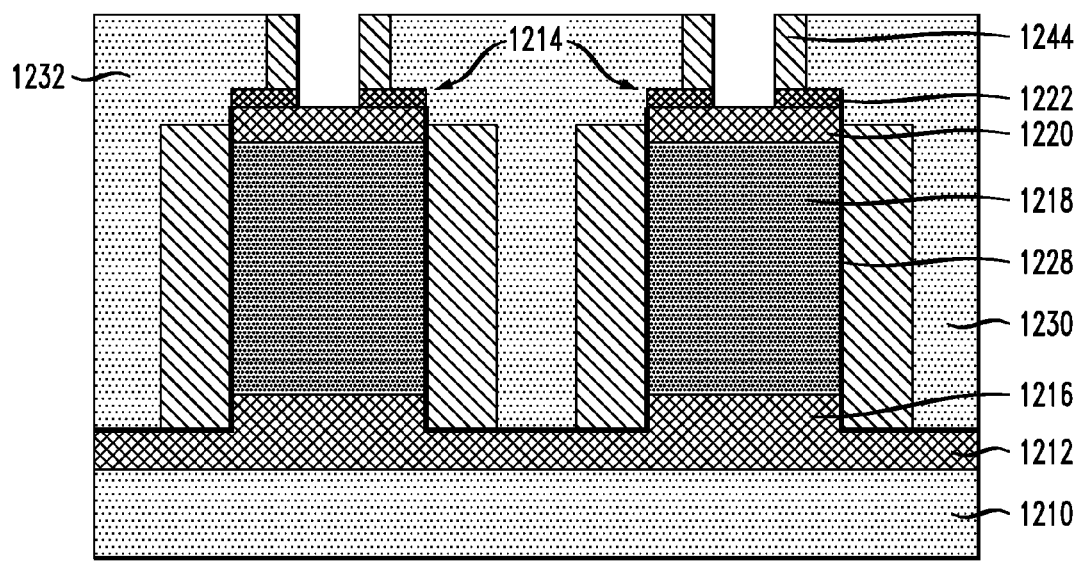

The memory cell islands 1214 are then exposed to an oxidation step to form the gate dielectric features 1228, and, subsequently, the gate features 1230 are formed on the sidewalls of the memory cell islands in a manner similar to that described above with respect to FIGS. 6A and 6B. The result is shown in FIG. 18. In further processing, the middle dielectric layer 1232 is formed by blanket depositing a dielectric layer and planarizing it back to the top of the sacrificial features. 1248. The sacrificial features and the portions of the lower liner feature layer underlying the sacrificial features are then removed using another selective anisotropic etch. This leaves small holes at the top of the memory cell islands as shown in FIG. 19. Once the sacrificial layer features are removed, they can be filled with PCM to form the PCM features 1224 by blanket depositing PCM over the film stack such that it fills the holes and then planarizing the PCM so that PCM is removed from the upper surface of the film stack.

With the PCM features 1224 formed as shown in FIG. 19, it simply becomes the task of forming the upper liner features 1234 and upper electrode features 1236 in order to achieve the memory cells 1200 shown in FIG. 12.

The just-described method of forming the memory cells 1200 has several advantages. Like the previous method embodiment described in FIGS. 2A-11B, the present method embodiment may, for example, be implemented using conventional, commercially available semiconductor processing equipment. In this particular method, however, the sizes of the memory cell islands 1214 are, in fact, determined using photolithography. The size of the PCM features 1224, in contrast, is largely independent of the photolithography step, and is, instead, dependent on the size of the voids 1246 created in the fill layer 1244. The size of the void is, in turn, largely dependent on the overhang created by the mask layer 1242. As a result, the PCM features can have lateral dimensions substantially smaller than those that can be created by conventional photolithography.

The just-described illustrative method also allows the PCM features 1224 to be self-aligned to their respective memory cell islands 1214. As before, such a self-aligned process is typically superior to one that relies on separate photolithography steps.

The PCM-based memory cells 100, 1200 described above are part of the design for an integrated circuit chip. The chip design may be created in a graphical computer programming language, and stored in a computer storage medium (such as a disk, tape, physical hard drive or virtual hard drive such as in a storage access network). If the designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are formed on a wafer. The photolithographic masks are utilized to define areas of the wafer (and/or the layers thereon) to be etched or otherwise processed.

The resulting integrated circuit chips may be distributed by the fabricator in raw wafer form (i.e., as a single wafer that has multiple unpackaged chips), as a bare die, or in packaged form. In the latter case, the chip is mounted in a single chip package (e.g., plastic carrier with leads that are affixed to a motherboard or other higher level carrier) or in a multichip package (e.g., ceramic carrier that has either or both surface interconnections or buried interconnections). In any case, the chip is then integrated with other chips, discrete circuit elements, and/or other signal processing devices as part of either an intermediate product (e.g., motherboard) or an end product. The end product maybe any product that includes integrated circuit chips, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments. For example, the materials utilized in the illustrative embodiments and the particular sequence of processing steps used to fabricate the illustrative embodiments may be changed without departing from the scope of the appended claims. These changes and various other modifications will be evident to one skilled in the art.

What is claimed is:

1. A method of forming a memory cell in an integrated circuit, the method comprising the steps of:
   forming a lower electrode feature;
   forming a silicon film stack on the lower electrode feature;
   forming a sacrificial layer on the silicon film stack;
   etching the sacrificial layer to form a sacrificial feature on the silicon film stack;
   forming an island on the lower electrode feature by etching exposed portions of the film stack down to the lower electrode using the sacrificial feature as a mask, the island having one or more sidewalls and comprising:
      a lower doped feature;
      a middle doped feature formed above the lower doped feature;
      an upper doped feature formed above the middle doped feature;
   forming a gate feature along each of the one or more sidewalls of the island, the gate feature overlying at least a portion of the middle doped feature of the island and operative to control an electrical resistance therein;
   trimming the sacrificial feature above the island to reduce a lateral dimension of the sacrificial feature relative to a lateral dimension of the island; and
   forming a phase change feature above the island at least in part by replacing the trimmed sacrificial feature with a phase change material, the phase change material being operative to switch between lower and higher electrical resistance states in response to an application of an electrical signal.

2. The method of claim 1, wherein trimming comprises the step of etching the sacrificial feature such that it has a minimum dimension in a plane perpendicular to a depth direction of the memory cell which is substantially smaller than that of the island.

3. The method of claim 1, wherein a minimum dimension of the phase change feature in a plane perpendicular to a depth direction of the memory cell is less than a prescribed minimum lithographic dimension.

4. The method of claim 1, wherein the step of forming the island further comprises forming a liner layer disposed above the upper doped feature.

5. The method of claim 1, wherein the phase change material comprises germanium, antimony, sulfur, selenium, or tellurium, or a combination thereof.

6. The method of claim 1, wherein the phase change material comprises a transition metal oxide.

7. The method of claim 1, wherein the phase change feature has a substantially constant width dimension in a plane perpendicular to a depth direction of the memory cell.

8. An integrated circuit comprising a plurality of memory cells, each of the plurality of memory cells formed by a method comprising the steps of:
   forming a lower electrode feature;
   forming an island on the lower electrode feature, the island having one or more sidewalls and comprising:
      a lower doped feature;
      a middle doped feature formed above the lower doped feature;
      an upper doped feature formed above the middle doped feature;
   forming a sacrificial feature above the island;
   forming a gate feature along each of the one or more sidewalls of the island, the gate feature overlying at least a portion of the middle doped feature of the island and operative to control an electrical resistance therein; and
   forming a phase change feature above the island at least in part by replacing at least a portion of the sacrificial feature with a phase change material, the phase change material being operative to switch between lower and higher electrical resistance states in response to an application of an electrical signal,
   wherein the gate feature of any one of the plurality of memory cells merges with the gate feature of at least one other memory cell within the plurality of memory cells.

9. The integrated circuit of claim 8, wherein the plurality of memory cells share a common lower electrode.

10. A method of forming a memory cell in an integrated circuit, the method comprising the steps of:
    forming a lower electrode feature;
    forming an island on the lower electrode feature, the island having one or more sidewalls and comprising:
       a lower doped feature;
       a middle doped feature formed above the lower doped feature;
       an upper doped feature formed above the middle doped feature;
    forming a sacrificial feature above the island;
    forming a gate feature along each of the one or more sidewalls of the island, the gate feature overlying at least a portion of the middle doped feature of the island and operative to control an electrical resistance therein; and
    forming a phase change feature above the island at least in part by replacing at least a portion of the sacrificial feature with a phase change material, the phase change material being operative to switch between lower and higher electrical resistance states in response to an application of an electrical signal;
    wherein the sacrificial feature comprises a dielectric material.

11. The method of claim 10, wherein the method further comprises the step of etching the sacrificial feature such that it has a minimum dimension in a plane perpendicular to a depth direction of the memory cell which is substantially smaller than that of the island.

12. The method of claim 10, wherein a minimum dimension of the phase change feature in a plane perpendicular to a depth direction of the memory cell is less than a prescribed minimum lithographic dimension.

13. The method of claim 10, wherein the step of forming the island further comprises forming a liner layer disposed above the upper doped feature.

14. The method of claim 10, wherein the phase change material comprises germanium, antimony, sulfur, selenium, or tellurium, or a combination thereof.

15. The method of claim 10, wherein the phase change material comprises a transition metal oxide.

16. An integrated circuit comprising a plurality of memory cells, each of the plurality of memory cells formed by a method comprising the steps of:
    forming a lower electrode feature;
    forming an island on the lower electrode feature, the island having one or more sidewalls and comprising:
        a lower doped feature;
        a middle doped feature formed above the lower doped feature;
        an upper doped feature formed above the middle doped feature;
    forming a sacrificial feature above the island;
    forming a gate feature along each of the one or more sidewalls of the island, the gate feature overlying at least a portion of the middle doped feature of the island and operative to control an electrical resistance therein; and
    forming a phase change feature above the island at least in part by replacing at least a portion of the sacrificial feature with a phase change material, the phase change material being operative to switch between lower and higher electrical resistance states in response to an application of an electrical signal;
    wherein the sacrificial feature comprises a dielectric material.

17. The integrated circuit of claim 16, wherein the plurality of memory cells share a common lower electrode.

18. The integrated circuit of claim 16, wherein the gate feature of any one of the plurality of memory cells merges with the gate feature of at least one other memory cell within the plurality of memory cells.

* * * * *